(12) United States Patent
Qiu et al.

(10) Patent No.: US 6,419,848 B1
(45) Date of Patent: Jul. 16, 2002

(54) PIEZOELECTRIC ACTUATOR, INK-JET TYPE RECORDING HEAD, MANUFACTURING METHOD THEREFOR, AND INK-JET PRINTER

(75) Inventors: Hong Qiu, Beijing (CN); Koji Sumi; Tsutomu Nishiwaki, both of Nagano (JP); Haruo Nakamura, Tokyo (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/518,189

(22) Filed: Mar. 2, 2000

(30) Foreign Application Priority Data

Mar. 2, 1999 (JP) ............................ 11-053931
Mar. 1, 2000 (JP) ........................ 2000-056138

(51) Int. Cl.⁷ ............................................. H01L 41/00
(52) U.S. Cl. .................... 252/62.9 R; 252/62.9 PZ; 427/100; 347/68; 310/320; 310/325; 29/25.35
(58) Field of Search .............. 252/62.9 R, 62.9 PZ; 347/68; 427/100; 310/320, 325; 29/25.35

(56) References Cited

U.S. PATENT DOCUMENTS 5,221,872 A * 6/1993 Nishida et al. ........ 252/62.9 R
5,634,999 A    6/1997 Takeuchi et al. .............. 156/89

FOREIGN PATENT DOCUMENTS

| EP | 408306 | 1/1991 |
| EP | 0 911 891 A2 | 4/1999 |
| EP | 0 980 103 A2 | 2/2000 |
| JP | 3-128681 | 5/1991 |
| JP | 8-104568 | * 4/1996 |
| JP | 9-157019 | 6/1997 |
| JP | 10-093153 | 4/1998 |

OTHER PUBLICATIONS

W-Ping Xu et al., "Application of Hydrothermal Mechanism for Tailor-Making Perovskite Titanate Films", IEEE Proc. of the 9th Int'l. Symp. on Electrets, Shanghai, China, pp. 617-622, Sep. 25-30, 1996.
Patent Abstracts of Japan, Japanese Publication No. 06-112543, "Piezoelectric Body, Ferroelectric Thin Film Element, and Its Manufacture", Pub. Date: Apr. 1994.

* cited by examiner

Primary Examiner—C. Melissa Koslow
(74) Attorney, Agent, or Firm—Sterne, Kessler, Goldstein & Fox P.L.L.C.

(57) ABSTRACT

A piezoelectric actuator, comprising a stacked structure consisting of a top electrode 5, a piezoelectric film 4, and a bottom electrode 3, wherein the piezoelectric film comprises a first group 42 of piezoelectric ceramic particles and a second group 43 of piezoelectric ceramic particles. A distinctive feature is that the particles constituting the first group of piezoelectric ceramic particles are larger than the jingo particles constituting the second group of piezoelectric ceramic particles, and the first group of piezoelectric ceramic particles and the second group of piezoelectric ceramic particles have mutually different compositions. The piezoelectric actuator can thus be manufactured by an application method in a low-temperature environment, and a thicker piezoelectric film can be obtained. In addition, a highly practical piezoelectric film can be provided by combining the advantages of a plurality of material types.

23 Claims, 4 Drawing Sheets

(A)

(B)

(C)

(D)

(E)

(F)

(G)

PIEZOELECTRIC ACTUATOR, INK-JET TYPE RECORDING HEAD, MANUFACTURING METHOD THEREFOR, AND INK-JET PRINTER

BACKGROUND OF THE INVENTION

1. Field of the Invention

The present invention relates to a technique for manufacturing a piezoelectric (electrostrictive) actuator functioning as an ink-expelling drive source for an ink-jet type recording head, and particularly to a technique for manufacturing a piezoelectric actuator obtained using an application method.

2. Description of the Related Art

Piezoelectric actuators functioning as electromechanical conversion elements comprise piezoelectric films sandwiched between upper and lower electrodes. These actuators are used for the ink-expelling drive sources of ink-jet type recording heads, as well as solid-element motors, relays, switches, filters, and the like. The piezoelectric films constituting such piezoelectric actuators are formed from lead zirconate titanate ($Pb(Zr, Ti)O_3$) and other PZT-based piezoelectric materials, or from piezoelectric/electrostrictive materials obtained by adding oxides of niobium, nickel, magnesium, or other metals to these systems. Piezoelectric films demonstrate an inverse piezoelectric effect, which is induced when an electric field is applied, making it possible to create deformation in piezoelectric actuators and to perform drive control on a submicron scale.

For example, the printing method disclosed in Japanese Patent Laid-open No. H3-128681 is known as a technique for forming such piezoelectric films. This printing method is a technique for obtaining piezoelectric films by forming a film on the desired substrate using a paste or slurry containing piezoelectric (electrostrictive) ceramic particles as its principal component, and heat-treating the resulting film. Using this printing method makes it easier to employ lithographic techniques or mechanical processing techniques such as laser processing or slicing, and allows any piezoelectric film configuration to be designed. Integration density of piezoelectric actuators can also be improved due to a greater variety of design options.

When, however, a piezoelectric actuator is fabricated by the printing method in accordance with the aforementioned Japanese Patent Laid-open No. H3-128681, the following problems are encountered because of the need to keep the atmosphere at 800 to 1000° C. during the heat treatment (sintering of piezoelectric film precursors). First, residual stress acts during the formation of a piezoelectric film, facilitating crack initiation and making it more difficult to obtain thicker piezoelectric films. Second, the piezoelectric characteristics of piezoelectric actuators vary because the high-temperature heat treatment vaporizes the lead in the piezoelectric film precursors and changes the stoichiometric ratio of the piezoelectric films. In addition, the lead diffuses in, or otherwise affects, the lower electrode, bringing about a reduction in the withstand voltage of the piezoelectric actuators and creating other problems.

Thicker piezoelectric films should be used to make piezoelectric actuators more reliable. It is also desirable that the piezoelectric actuators be fabricated in a low-temperature environment in order to maintain the same piezoelectric film composition and to prevent lead from being vaporized by the heat treatment.

In addition, Japanese Patent Laid-open No. H9-157019 describes obtaining complex oxide films through the use of materials prepared by adding complex oxide powders and complex oxide sols to solvents. No reference is made in this publication, however, to the type of composition used for such complex oxide sols.

With the foregoing in view, it is an object of the present invention to fabricate a piezoelectric actuator by an application method in a low-temperature environment and to make it possible to obtain a thicker piezoelectric film. Another object is to provide a highly practical piezoelectric film by combining the advantages of a plurality of material types. Yet another object is to provide a piezoelectric actuator equipped with such a piezoelectric film, to provide an ink-jet type recording head and ink-jet printer equipped with this piezoelectric actuator, and to provide a method for manufacturing these.

SUMMARY OF THE INVENTION

The piezoelectric actuator of the present invention is a piezoelectric actuator comprising a stacked structure consisting of a top electrode, a piezoelectric film, and a bottom electrode, wherein the piezoelectric film comprises a first group at piezoelectric ceramic particles and a second group of piezoelectric ceramic particles; the particles constituting the first group of piezoelectric ceramic particles are larger than the particles constituting the second group of piezoelectric ceramic particles; and the first group of piezoelectric ceramic particles and second group of piezoelectric ceramic particles have different compositions.

The fact that the first group of piezoelectric ceramic particles and the second group of piezoelectric ceramic particles have different compositions makes it possible to obtain a piezoelectric actuator whose composition combines the advantages of both.

The first group of piezoelectric ceramic particles should preferably be composed of a material whose piezoelectric constant is higher than that of the second group of piezoelectric ceramic particles.

Adequate piezoelectric characteristics of the film as a whole can be obtained because the first group of piezoelectric ceramic particles (large particles) have a high piezoelectric constant.

The second group of piezoelectric ceramic particles should preferably be composed of a material having higher plasticity than the first group of piezoelectric ceramic particles.

A piezoelectric film having high plasticity overall can be obtained because of the high plasticity of the second group of piezoelectric ceramic particles.

The plasticity of film or bulk can be evaluated by Young's modulus as physical or mechanical characteristics. Material having low Young's modulus is soft and has a high plasticity. To measure Young's modulus of thin film having a micron scale thickness, we can use nano-indentor (n-indentor). To measure Young's modulus of thick material such as bulk, we can use a cantilever.

Young's modulus is, for example, 70–100 GPa (gigapascal) for PZT, 10–20 GPa for PMN-PZT. Material having low Young's modulus and high plasticity has advantages such as hardness to break when applying external force (stress) and easiness to make thick films. On the other hand, if the material is too soft (i.e. Young's modulus is too low), the film cannot efficiently transmit a mechanical force. In other words, the film absorbs the force due to a large elasticity.

This invention may, by combination of crystal with high Young's modulus and crystal with low Young's modulus, flexibly control the properties of the films.

The particle size of the first group of piezoelectric ceramic particles should preferably be from 0.2 μm to less than 10 μm. This is because the piezoelectric film has inadequate piezoelectric characteristics when the size is less than 0.2 μm, whereas using particles measuring 10 μm or greater makes the irregularities on the surface of the piezoelectric film more pronounced and has an adverse effect on the reliability of the piezoelectric film. In addition, the particle size of the second group of piezoelectric ceramic particles should preferably be from 10 nm to less than 100 nm. Furthermore, the thickness of the piezoelectric film should preferably be from 2 μm to 100 μm.

The composition of the piezoelectric ceramic particles constituting the first group of piezoelectric ceramic particles or the second group of piezoelectric ceramic particles may be any of the following: lead titanate ($PbTiO_3$), lead zirconate titanate ($Pb(Zr,Ti)O_3$), lead zirconate ($Pb\ ZrO_3$), lead lanthanum titanate (($Pb, La), TiO_3$), lead lanthanum zirconate titanate (($Pb, La) (Zr, Ti)O_3$), lead zirconate titanate magnesium niobate ($Pb(Zr, Ti) (Mg, Nb)O_3$), $Pb(Ni, Nb)O_3$—$Pb(Zr, Ti)O_3$ (PNN-PZT), or a material obtained by adding any two elements selected. from W, Ni, Mn, Zn, and Co to lead zirconate titanate.

The composition of the first group of piezoelectric ceramic particles should preferably be any of the following; lead zirconate titanate ($Pb(Zr, Ti)O_3$; PZT), lead lanthanum zirconate titanate (($Pb, La)(Zr, Ti)O_3$), barium titanate ($BaTiO_3$), or lead nickel niobate zirconate titanate ($Pb(Ni, Nb)O_3$—$Pb(Zr, Ti)O_3$: PNN-PZT). This is because PZT and the other materials in the first group have good piezoelectric characteristics.

The composition of the second group of piezoelectric ceramic particles may be any of the following: lead magnesium niobate zirconate titanate ($Pb(Mg, Nb)(Zr, Ti)O_3$: PMN-PZT), potassium niobate tantalate ($K(Nb, Ta)O_3$), or bismuth.sodium titanate ($Bi, Na)TiO_3$. This is because PMN-PZT and the other Materials in the second groups are characterized by consisting of small particles and having excellent plasticity.

The ink-jet type recording head of the present invention comprises a pressure chamber substrate for providing chambers, and the piezoelectric actuator of the present invention, in which pressure chambers are formed at positions in which pressurization is possible.

The ink-jet printer of the present invention comprises the ink-jet type recording head of the present invention.

The method for manufacturing a piezoelectric actuator in accordance with the present invention comprises an application step in which a piezoelectric film precursor obtained by mixing piezoelectric ceramic particles and an amorphous composite oxide whose composition is different from that of the particles is formed into a film of prescribed thickness by an application method, and a crystallization step in which the piezoelectric film precursor is hydrothermally treated under constant conditions, and the piezoelectric film precursor is crystallized.

The piezoelectric ceramic particles should preferably be composed of a material whose piezoelectric constant is higher than that of the crystallized amorphous composite oxide.

In addition, the crystallized amorphous composite oxide should preferably have higher plasticity than the piezoelectric ceramic particles.

The composition of the piezoelectric ceramic particles may be any of the following: lead zirconate titanate ($Pb(Zr, Ti)O_3$: PZT), lead lanthanum zirconate titanate (($Pb, La)(Zr, Ti)O_3$), barium titanate ($BaTiO_3$) or lead nickel niobate zirconate titanate ($Pb(Ni, Nb)O_3$—$Pb(Zr, Ti)O_3$: PNN-PZT).

The composition of the amorphous composite oxide may be any of the following: lead magnesium niobate zirconate titanate ($Pb(Mg, Nb)(Zr, Ti)O_3$: PMN-PZT), potassium niobate tantalate ($K(Nb, Ta)O_3$), or bismuth sodium titanate ($Bi, Na)TiO_3$.

The size of the piezoelectric ceramic particles is characterized by ranging from 0.2μ to less than 10 μm. The amorphous portion of the piezoelectric film precursor is characterized by growing into piezoelectric ceramic particles measuring from 10 nm to less than 100 nm in the crystallization step.

The temperature of the entire manufacturing process is lower than that of a conventional manufacturing method because the aforementioned process allows the piezoelectric film precursor formed by the application method to be crystallized by a hydrothermal treatment. The thickness of the piezoelectric film precursor can be set from 2 μm to less than 100 μm by admixing piezoelectric ceramic particles into the piezoelectric film precursor.

To maintain constant conditions during the hydrothermal treatment, the treatment solution should preferably be a barium hydroxide aqueous solution, a lead hydroxide aqueous solution, or a mixture thereof, adjusted to a concentration of 0.05 M to 2.0 M. In addition, the treatment temperature should preferably be kept within a temperature range of 120° C. to 200° C. Furthermore, the treatment pressure should preferably be kept constant at between 2 atm and 10 atm, and the treatment time should be set to between 10 minutes and 120 minutes.

The method for manufacturing an ink-jet type recording head in accordance with the present invention comprises a step of processing a substrate to form pressure chambers, and a step of manufacturing a piezoelectric actuator at positions in which the pressure chambers can be pressurized, by the method for manufacturing a piezoelectric actuator in accordance with the present invention.

DESCRIPTION OF THE PREFERRED EMBODIMENTS

Embodiments of the present invention will now be described with reference to drawings. As used herein, the term "particle size" reters to the average size of particles. For example, particles are not necessarily perfect spheres (with a perfectly circular cross section), so several diameters are measured in this case, and their average or the like is taken.

Figure 1:
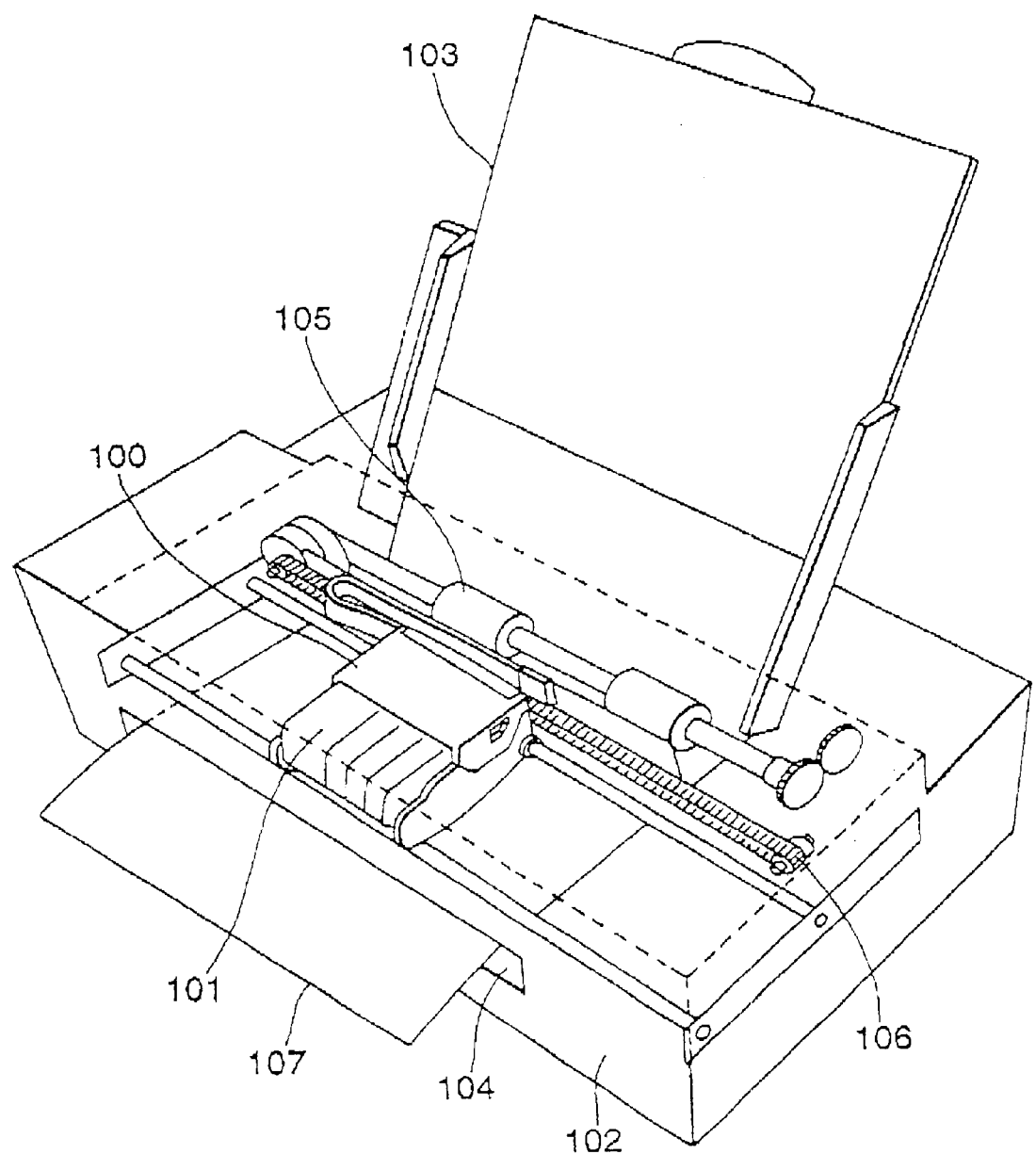
FIG. 1 is a block diagram of an ink-jet printer.

The structure of the ink-jet printer is shown in FIG. 1. The ink-jet printer primarily comprises an ink-jet type recording head 100, a main body 102, and a tray 103. The ink-jet type recording head 100 comprises a four-color (yellow, magenta, cyan, black) ink cartridge 101, allowing full-color printing to be performed. This ink-jet printer has printer-server functions and can print documents while sorting printing instructions from the clients connected to a network (LAN). Printing data received from the clients are stored in internal printer memory. This memory is used as an area for storing print images, as a work area for image formation, as a data buffering tool, and the like. A CPU reads print data from the memory and expands print images to a specific address in the memory. The ink-jet type recording head 100 scans paper 107 in the transverse direction by means of a head drive mechanism 106 and expels ink according to the print timing received from the CPU. The main body 102 has a tray 103 on the back and contains an auto sheet feeder (automatic continuous paper-feeding mechanism) 105. Paper 107 is automatically advanced and discharged through a discharge port 104 in the front surface.

Figure 2:
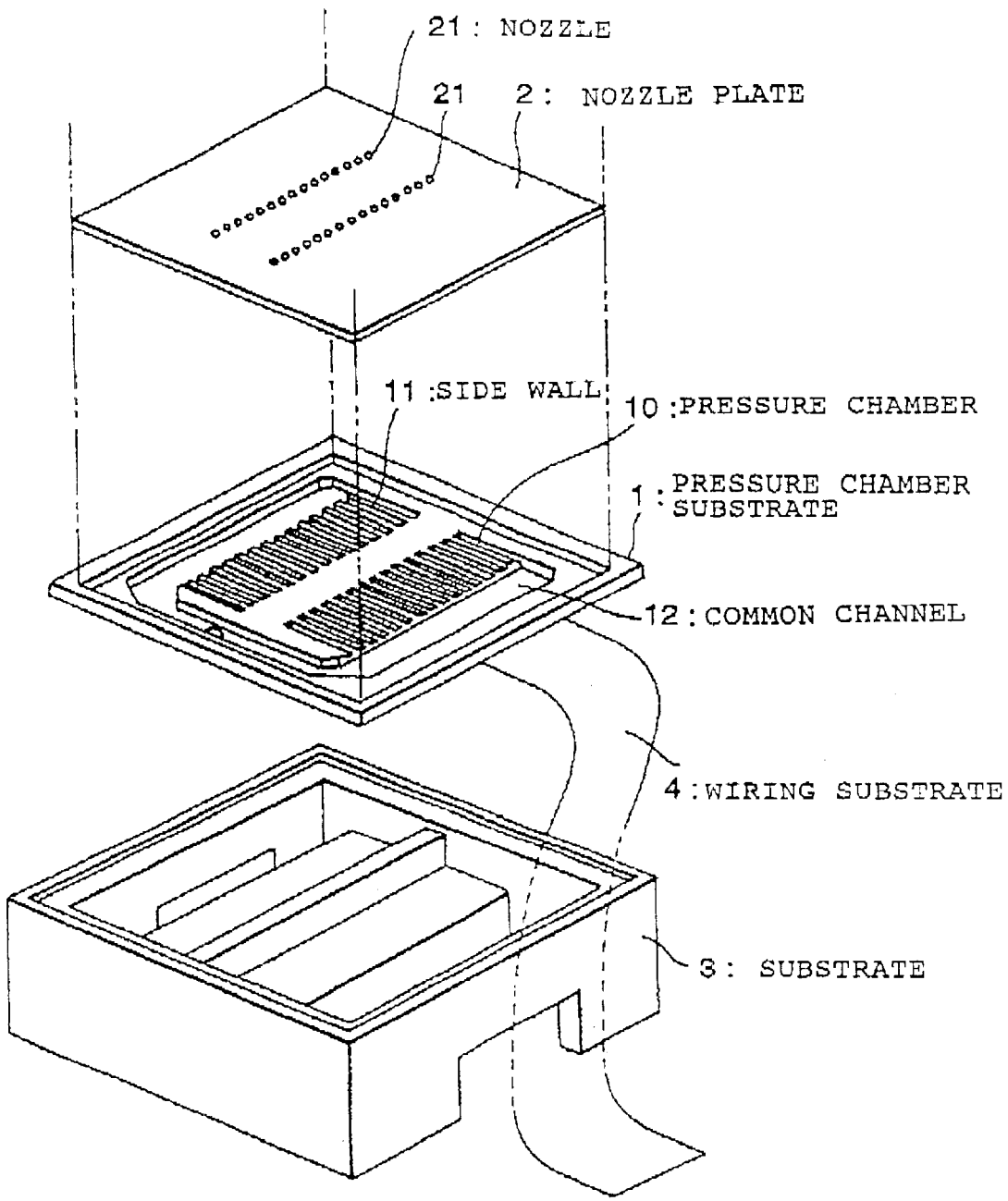
FIGS. 2 is an exploded perspective view of an ink-jet type recording head.

A perspective view depicting the entire structure of the ink-jet type recording head is shown in FIG. 2. The type shown here is one in which a channel for the shared. passage of ink is disposed inside the pressure chamber substrate. As can be seen in the drawing, the ink-jet type recording head comprises a pressure chamber substrate 1, a nozzle plate 2, and a substrate 3. With the pressure chamber substrate 1, a silicon single crystal substrate is etched or the like, and separate formations are obtained. The pressure chamber substrate 1 is provided with a plurality of strip-shape pressure chambers 10 and with a common channel (ink reservoir) 12 for feeding the ink to all the pressure chambers 10. The pressure chambers 10 are separated by side walls 11. Piezoelectric actuators pertaining to the present invention are provided to the pressure chamber substrate 1 on the side of the substrate 3. The wiring from the piezoelectric actuators is gathered in a wiring substrate 4 (flexible cable) and connected to the external circuitry of the substrate 3. The nozzle plate 2 is pasted to the pressure chamber substrate 1. Nozzles 21 for expelling ink droplets are formed at positions corresponding to the pressure chambers 10 in the nozzle plate 2. The substrate 3 is composed of a plastic, metal, or the like, and serves as a mounting platform for the pressure chamber substrate 1.

FIG. 4G is a cross section of the main part of the ink-jet type recording head of the present embodiment. The drawing depicts a cross section obtained by cutting the aforementioned main part along a plane at a right angle to the pressure chambers. In the drawing, the same symbols are used to designate structures identical to those in FIG. 2, and these structures are omitted from the description. A piezoelectric actuator 20 is formed through the agency of a diaphragm film 2 on a pressure chamber substrate 1, which consists of a silicon single crystal substrate. The piezoelectric actuator 20 comprises a piezoelectric film 4 sandwiched between a top electrode 5 and a bottom electrode 3. Applying the desired voltage to the piezoelectric actuator 20 induces deformation in the piezoelectric film 4 and causes pressure to be applied through the agency of the diaphragm film 2 to the ink in the pressure chambers 10. The ink in the pressure chambers 10 is expelled through nozzles 21 and deposited on the desired recording paper, making printing possible.

Figure 3:
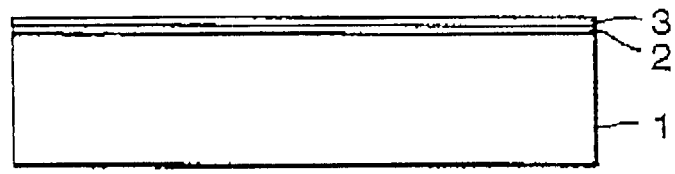
FIG. 3A–3D are cross sections depicting the steps for manufacturing the ink-jet type recording head.
Figure 3:
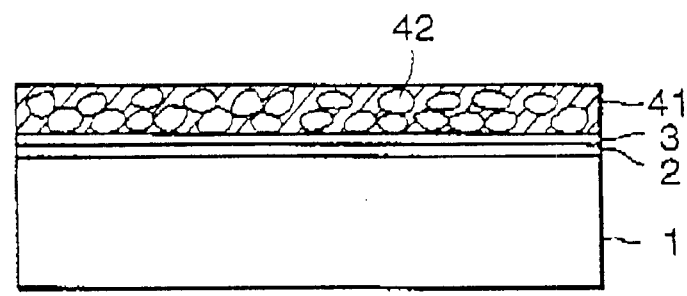
Figure 3:
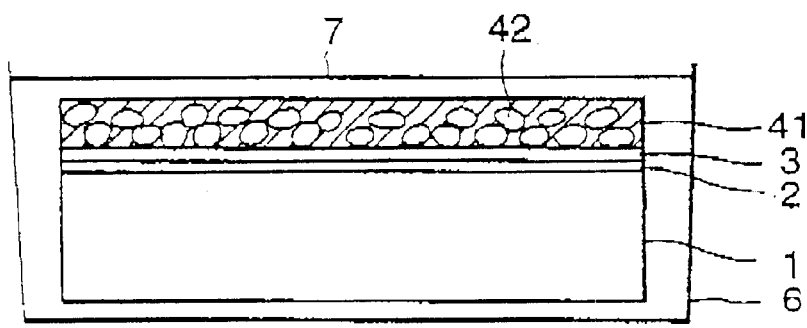
Figure 3:
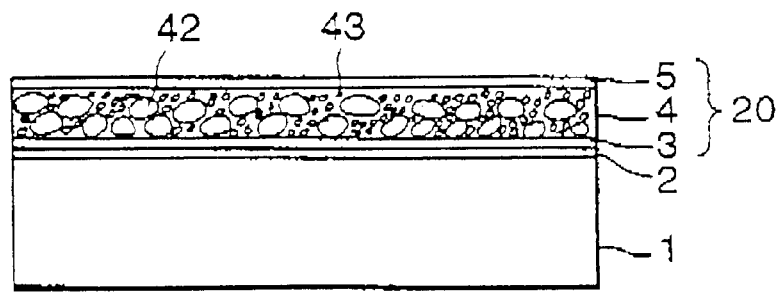
Figure 4:
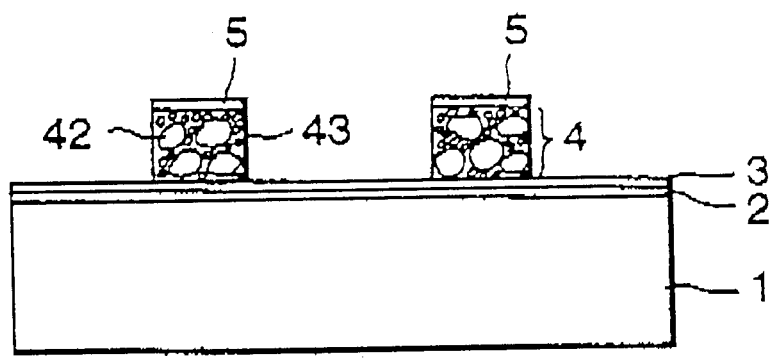
FIG. 4E–4G are cross sections depicting the steps for manufacturing the ink-jet type recording head.
Figure 4:
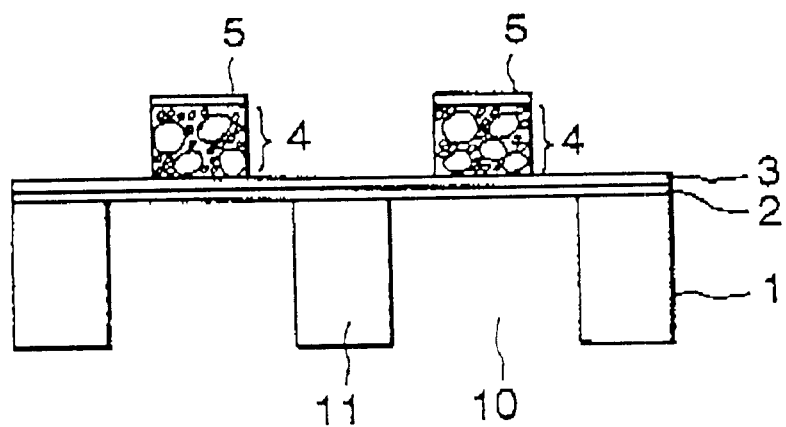
Figure 4:
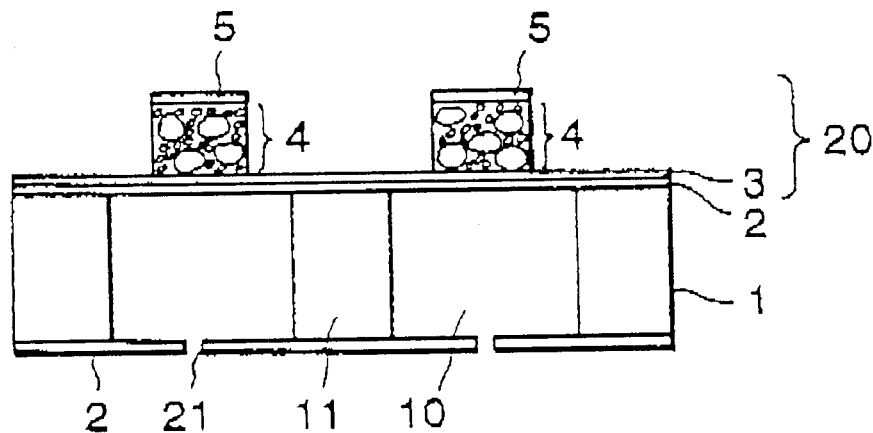

Steps for manufacturing the main part of an ink-jet type recording head will now be described (together with the steps for manufacturing a piezoelectric actuator) with reference to FIGS. 3 and 4. First, the diaphragm film 2 and the bottom electrode 3 are formed on the substrate 1, as shown in FIG. 3A. The material of the substrate 1 may be any oxide material or non-oxide material that has high mechanical strength and is capable of withstanding corrosion during the hydrothermal treatment step described below. It is possible to use a silicon substrate or a substrate obtained by processing a material containing any of the following as principal components thereof: aluminum oxide, magnesium oxide, zirconium oxide, aluminum nitride, and silicon nitride. The diaphragm film, although thin, has excellent substrate characteristics.

The diaphragm film 2 functions as an actuation plate for transmitting the displacement of the piezoelectric actuator to the substrate 1. The diaphragm film 2 may, for example, be a silicon dioxide film with a thickness of about 1.0 $\mu$m (obtained by thermal oxidation) when the substrate 1 is a silicon single crystal substrate. This step involves processing the film at a high temperature in oxygen or an oxygen atmosphere containing water vapor. The diaphragm film 2 is not limited to a silicon dioxide film and may be a zirconium oxide film, a tantalum oxide film, a silicon nitride film, or an aluminum oxide film. It is also possible to dispense with the diaphragm as such and to allow the below-described bottom electrode to function as a diaphragm. In addition, the formation of the diaphragm film 2 is not limited to thermal oxidation and can be accomplished by means of CVD (Chemical vapor Deposition).

A bottom electrode 3 is formed following the formation of the diaphragm film 2. The material of the bottom electrode 3 may he pure metal, an alloy, or an electroconductive ceramic. Suitable examples include platinum, titanium, palladium, rhodium, and other high-melting noble metals. Specifically, a film with a thickness of 100 nm is formed by sputtering platinum to obtain a bottom electrode 3. When the bottom electrode 3 is a platinum film, and adhesive layer (not shown) composed of titanium, chromium, or the like may be interposed in order to enhance the adhesion between the diaphragm film 2 and the bottom electrode 3. This adhesive layer may, for example, be formed in a thickness of 50 nm by sputtering.

A piezoelectric film precursor 41 is subsequently formed by application, as shown in FIG. 3B. As will be described below, piezoelectric (electrostrictive) ceramic particles 42 are admixed into the piezoelectric film precursor 41. The following piezoelectric ceramics having piezoelectric properties are suitable as such piezoelectric films: lead titanate (PbTiO$_3$), lead zirconate titanate (Pb(Zr,Ti)O$_3$: PZT), lead zirconate (Pb ZrO$_3$), lead lanthanum titanate ((Pb, La), TiO$_3$), lead lanthanum zirconate titanate ((Pb, La)(Zr, Ti)O$_3$), lead zirconate titanate magnesium niobate (Pb(Zr, Ti)(Mg, Nb)O$_3$: PZT-PMN), Pb(Ni, Nb)O$_3$—Pb(Zr, Ti)O$_3$ (PNN-PZT), and materials obtained by adding any two elements selected from W, Ni, Mn, Zn, and Co to lead zirconate titanate.

In particular, the piezoelectric film precursor 41 should preferably have other components that have a composition that differs from the compositions of the piezoelectric ceramic particles 42.

In addition, a composition with good piezoelectric characteristics (piezoelectric constant, high-frequency response, and the like) should preferably be used for the piezoelectric ceramic particles 42. PZT is an example of such a composition. Other acceptable compositions are (Pb, La)(Zr, Ti)O$_3$, BaTiO$_3$, and PNN-PZT.

For components other than the piezoelectric ceramic 42, compositions with higher plasticity than PZT are preferred, and those consisting of small crystal grains are particularly preferred. For example, PMN-rich PMN-PZT is an appropriate composition. It is also possible to use K(Nb, Ta)O$_3$ and (Bi, Na)TiO$_3$. Using high-plasticity compositions for components other than the piezoelectric ceramic in such a manner makes it possible to improve the plasticity of the entire piezoelectric film while preserving the piezoelectric characteristics of the piezoelectric ceramic 42 (PZT or the like). In addition, using materials composed of small crystal grains makes it possible to efficiently fill up the gaps in the piezoelectric ceramic 42 and to reduce the number of such gaps, yielding a piezoelectric film through which electric current is less likely to pass.

Following is a description of a method for preparing a hydroxide hydrate complex, or sol (piezoelectric film precursor solution), of the metal components constituting the piezoelectric film when PMN-PZT is used as a composition for the components other than the piezoelectric ceramic particles 42. For example, 2-n-butoxyethanol is used as the primary solvent, and the following compounds are dissolved therein under mixing and stirring titanium tetraisopropoxide, pentaethoxyniobium, and tetra-n-propoxyzirconium. Diethanolamine is subsequently added and stirred at room temperature for 20 minutes. Lead acetate and magnesium acetate are then added, stirred unchanged for 20 minutes after being heated to 80° C., and allowed to cool naturally to room temperature thereafter. This step yields a PMN-PZT piezoelectric film precursor solution.

Piezoelectric ceramic particles 42 measuring about 0.2 to 10 $\mu$m are added to, and uniformly mixed in, this piezoelectric film precursor solution. The particle size should preferably fall within the aforementioned range because when the piezoelectric ceramic particles 42 measure less than 0.2 $\mu$m, the piezoelectric characteristics of the piezoelectric film are inadequate, and when the particles measure more than 10 $\mu$m, the surface irregularities of the piezoelectric film become more pronounced, and the piezoelectric film becomes less reliable. Commercially available products may be used as the piezoelectric ceramic particles 42. The following compositions are suitable: lead titanate, lead zirconate titanate, lead zirconate, lead lanthanum titanate, lead lanthanum zirconate titanate, lead zirconate titanate magnesium niobate, and other piezoelectric ceramics having piezoelectric properties. In particular, lead zirconate titanate, which has high piezoelectric constant, is preferred. A film with a thickness of 2 to 100 $\mu$m is formed on the bottom electrode 3 by a method in which the piezoelectric film precursor solution into which the piezoelectric ceramic particles 42 have been admixed is applied to the electrode. The film is dried for 10 minutes at a temperature of 180° C., yielding an amorphous piezoelectric film precursor 41. This piezoelectric film precursor 41 contains piezoelectric ceramic particles 42 (FIG. 3B).

The piezoelectric film precursor 41 is subsequently crystallized during a hydrothermal treatment step, as shown in FIG. 3C. The term "hydrothermal treatment step" refers to a step in which the piezoelectric film precursor is immersed in an alkali aqueous solution and crystallized, as described, for example, in an article titled "Application of Hydrothermal Mechanism for Tailor-making Perovskite Titanate Films," IEEE Proc. of the $9^{th}$ Int'l Symp. on Electrets, Shanghai, China, September 21–30, pp. 617–622 (1996), W-ping Xu, Masanori Okuyama, et al. This hydrothermal method has many advantages because it allows piezoelectric film precursors to be crystallized at a comparatively low temperature (for example, 200° C. or lower). For example, a low-temperature process makes it less likely that a film will develop the internal stress commonly induced during the crystallization of piezoelectric film precursors. Crack initiation can thus be prevented, and thicker piezoelectric films obtained. A thicker piezoelectric film is more reliable because only a weak electric field is generated in the film when voltage is applied.

Problems are encountered during the etching of silicon substrates or the piezoelectric film precursor 41 when the alkalis described in the aforementioned article are used, but the inventors addressed these problems and performed the hydrothermal treatment described below. First, a barium hydroxide aqueous solution, a lead hydroxide aqueous solution, or a mixture of these solutions is obtained in a concentration of 0.05 to 2.0 M [mol/L] to prepare for the hydrothermal treatment. A barium hydroxide aqueous solution has lower corrosivity with respect to silicon substrates than does potassium hydroxide, and hence has the advantage of expanding the range of materials that can be used for the substrate 1.

A water tank 6 is filled with this treatment solution 7. The piezoelectric film precursor obtained in the above-described steps (FIGS. 3A and 3B) is immersed in the treatment solution 7 for each substrate 1, and crystallization is promoted in an autoclave. The corresponding temperature of the hydrothermal treatment is set to between 120 and 200° C. This is because a temperature therefore below this range fails to promote crystallization, whereas a temperature above this range creates conditions under which the piezoelectric film precursor or the substrate 1 is etched. A treatment temperature of 140° C. is particularly suitable, High-quality crystals can be obtained by setting the processing pressure between 2 and 10 atm. A processing pressure of 4 atm is particularly suitable. The treatment time is set between 10 and 120 minutes, with about 90 minutes being particularly preferred. This is because a short treatment time tails to afford adequate crystallization, whereas an excessively long treatment time results in substrate etching. In this hydrothermal treatment step, the amorphous portion of the piezoelectric film precursor 41 crystallizes, and the piezoelectric film precursor 41 is converted to a piezoelectric film 4.

The piezoelectric film 4 comprises an area of piezoelectric ceramic particles 43 (second group of piezoelectric ceramic particles (small particles) such as PMN-PZT) resulting from the crystallization of the amorphous portion of the piezoelectric film precursor 41 by the hydrothermal treatment, and an area of piezoelectric ceramic particles 42 (first group of piezoelectric ceramic particles (large particles) such as PZT) crystallized in advance. Gaps between the piezoelectric ceramic particles (large particles) 42 are tilled in with the piezoelectric ceramic particles (small particles) 43. It has been confirmed that the size of the piezoelectric ceramic particles (small particles) 43 ranges from 10 nm to less than 100 nm.

Following the hydrothermal treatment step, a top electrode 5 is formed on the piezoelectric film 4, as shown in FIG. 3D. A 200-nm platinum film is formed on the piezoelectric film 4 by electron-beam vapor deposition, sputtering, or another thin-film stacking technique, yielding a top electrode 5. Platinum is not the only option, and iridium, platinum-iridium alloys, iridium oxide, aluminum, or the like may also be used. A piezoelectric actuator 20 having a piezoelectric film 4 with a thickness of 2 to 100 $\mu$m an be manufactured using the above-described steps.

The piezoelectric actuator 20 is subsequently separated in accordance with the positions of the pressure chambers formed in subsequent manufacturing steps, as shown in FIG. 4E. A resistance film (not shown) of uniform thickness is applied to the top electrode 5 by spinning, spraying, or another appropriate method, and this resistance film is patterned by exposure and development. The resistance film is used as a mask to dry-etch the top electrode 5 and piezoelectric film 4 to obtain a prescribed separation shape, and these are separated in accordance with the positions of the pressure chambers. This step is performed using an appropriate selective gas.

The substrate 1 is subsequently etched, yielding pressure chambers 10, as shown in FIG. 4F. An etching mask (not shown) is first applied in accordance with the positions in which the pressure chambers 10 are to be formed, and the pressure chambers 10 are formed by parallel-plate reactive ion etching, inductive coupling, electron cyclotron resonance, helicon wave excitation, magnetron treatment, plasma etching, ion-beam etching, or another dry etching technique. A rectangular, tapered, or other shape can be etched by appropriately setting the etching conditions with consideration for the gas type, gas pressure, gas flow rate, bias voltage, and the like. The remaining unetched portions become side walls 11.

A nozzle plate 2 is subsequently pasted to the etched silicon single crystal substrate 1 with the aid of a resin or the like, as shown in FIG. 4G. At this time, the nozzles 21 are aligned such that their positions correspond to the spaces between the pressure chambers 10. The silicon single crystal substrate 1 bonded to the nozzle plate 2 is mounted on the substrate 3, completing the ink-jet type recording head.

According to this embodiment, the manufacturing process can be conducted at a lower temperature (200° C. or lower) because the piezoelectric film precursor obtained by application is crystallized by means of a hydrothermal treatment. In particular, the presence of pre-crystallized piezoelectric ceramic particles in the piezoelectric film precursor allows a thicker (film thickness: 2 to 100 μm) piezoelectric film to be obtained by a method in which the precursor is crystallized by means of a hydrothermal treatment in a low-temperature environment. In addition, the low-temperature process can relieve the residual stress commonly induced in piezoelectric films being formed. This is because the method of the present embodiment allows piezoelectric films to be formed at a low temperature (200° C. or lower). This is in contrast to conventional printing methods, which entail forming piezoelectric films at high temperatures (1000° C. and higher). The displacement characteristics and reliability of the piezoelectric actuator can therefore be improved.

In addition, manufacturing costs can be reduced because crack initiation can be prevented by reducing residual stress in the piezoelectric films being formed. Piezoelectric characteristics can also be rendered more stable because vaporization of lead components from piezoelectric film precursors can be suppressed by means of a low-temperature process and because the composition of the piezoelectric film is easier to control. The manufacturing method of the present embodiment also conserves energy and has minimal impact on the natural environment.

Furthermore, the entire piezoelectric film can be endowed with pronounced piezoelectric properties because a material having adequate piezoelectric characteristics is selected for the large particles. Because a highly plastic material is selected for the large particles, the plasticity of the entire piezoelectric film can be improved while the pronounced piezoelectric properties afforded by the large particles are preserved. Another advantage is that gaps between crystal grains can be reduced because small crystal grains are selected as the small particles.

The piezoelectric actuator of the present embodiment can be used for the above-described ink-expelling drive sources of ink-jet type recording heads, as well as solid-element motors, relays, switches, filters, and the like. The actuator may also be used for shutters, pumps, fans, delay lines, lead selectors, tuning-fork oscillators, tuning-fork clocks, transceivers, piezoelectric pickups, piezoelectric earphones, piezoelectric microphones, SAW filters, RF modulators, resonators, delay elements, multistrip couplers, piezoelectric accelerometers, piezoelectric speakers, ferroelectric memory devices, and the like.

With the piezoelectric actuator of the present invention, high reliability can be achieved because thick piezoelectric films can be obtained. Advantages possessed by a plurality of material types can also be combined, yielding, for example, a piezoelectric film that has excellent piezoelectric characteristics and film plasticity. The ink-jet type recording head of the present invention can be highly reliable because a piezoelectric actuator capable of affording high reliability is used as an ink-expelling drive source. The ink-jet printer of the present invention can provide high-legibility printing matter because of the high reliability of the ink-jet type recording head.

The present invention also provides a method for manufacturing these devices.

What is claimed is:

1. A piezoelectric actuator, comprising:
   a top electrode;
   a piezoelectric film; and
   a bottom electrode,
   wherein said piezoelectric film comprises a first group of piezoelectric ceramic particles and a second group of piezoelectric ceramic particles, and
   wherein the particles constituting the first group of piezoelectric ceramic particles are larger than the particles constituting the second group of piezoelectric ceramic particles, and
   wherein the first group of piezoelectric ceramic particles and the second group of piezoelectric ceramic particles have different compositions.

2. A piezoelectric actuator as defined in claim 1, wherein said first group of piezoelectric ceramic particles composed of a material with a piezoelectric constant higher than that of said second group of piezoelectric ceramic particles.

3. A piezoelectric actuator as defined in claim 1, wherein said second group of piezoelectric ceramic particles is composed of a material having higher plasticity than said first group of piezoelectric ceramic particles.

4. A piezoelectric actuator as defined in claim 1, wherein the particle size of said first group of piezoelectric ceramic particles ranges from 0.2 μm to less than 10 μm.

5. A piezoelectric actuator as defined in claim 1, wherein the particle size of said second group of piezoelectric ceramic particles ranges from 10 nm to less than 100 nm.

6. A piezoelectric actuator as defined in claim 1 or 2, wherein the thickness of said piezoelectric film ranges from 2 μm to 100 μm.

7. A piezoelectric actuator as defined in claim 1 wherein the composition of the piezoelectric ceramic particles constituting said first group of piezoelectric ceramic particles or said second group of piezoelectric ceramic particles are selected from the group consisting of lead titanate, lead zirconate titanate, lead zirconate, lead lanthanum titanate, lead lanthanum zirconate titanate, lead magnesium niobate zirconate titanate, and materials obtained by adding any two elements selected from W, Ni, Mn, Zn, and Co to lead zirconate titanate.

8. A piezoelectric actuator as defined in claim 1, wherein the composition of said first group of piezoelectric ceramic particles is selected from the group consisting of lead zirconate titanate, lead lanthanum zirconate titanate, barium titanate, and lead nickel niobate zirconate titanate.

9. A piezoelectric actuator as defined in claim 1, wherein the composition of said second group of piezoelectric ceramic particles is selected from the group consisting of lead magnesium niobate zirconate titanate, potassium niobate tantalate, and bismuth sodium titanate.

10. An ink-jet type recording head, comprising:
   a pressure chamber substrate for providing pressure chambers; and
   a piezoelectric actuator as defined in claim 1, wherein said pressure chambers are formed at positions in which pressurization is possible.

11. An ink-jet printer, comprising an ink-jet type recording head as defined in claim 10.

12. A method for manufacturing a piezoelectric actuator having a top electrode, a piezoelectric film, and a bottom electrode, comprising:
   an application step in which a piezoelectric film precursor obtained by mixing piezoelectric ceramic particles and an amorphous composite oxide whose composition is different from that of the particles is formed into a film of prescribed thickness by an application method; and
   a crystallization step in which said piezoelectric film precursor is hydrothermally treated under constant conditions, so that the amorphous composite oxide in the piezoelectric film precursor is crystallized.

13. A method for manufacturing a piezoelectric actuator as defined in claim 12, wherein said piezoelectric ceramic particles are composed of a material with a piezoelectric constant higher than that of said crystallized amorphous composite oxide.

14. A method for manufacturing a piezoelectric actuator as defined in claim 12 or 13, wherein said crystallized amorphous composite oxide has a higher plasticity than said piezoelectric ceramic particles.

15. A method for manufacturing a piezoelectric actuator as defined in claim 12, wherein the composition of said piezoelectric ceramic particles is selected from the group consisting of lead zirconate titanate, lead lanthanum zirconate titanate, barium titanate, and lead nickel niobate zirconate titanate.

16. A method for manufacturing a piezoelectric actuator as defined in claim 12, wherein the composition of said amorphous composite oxide is selected from the group consisting of lead magnesium niobate zirconate titanate, potassium niobate tantalate, and bismuth sodium titanate.

17. A method for manufacturing a piezoelectric actuator as defined in claim 12, wherein the size of said piezoelectric ceramic particles ranges from 0.2 $\mu$m to less than 10 $\mu$m.

18. A method for manufacturing a piezoelectric actuator as defined in claim 12, wherein said amorphous composite oxide grows into piezoelectric ceramic particles measuring from 10 nm to less than 100 nm in said crystallization step.

19. A method for manufacturing a piezoelectric actuator as defined in claim 12, wherein said prescribed thickness is confined to a range of 2 to 100 $\mu$m.

20. A method for manufacturing a piezoelectric actuator as defined in claim 12, wherein a treatment solution, adjusted to a concentration of 0.05 to 2.0 M as a constant condition of said hydrothermal treatment, is selected from the group consisting of a barium hydroxide aqueous solution, a lead hydroxide aqueous solution, and a mixed aqueous solution thereof.

21. A method for manufacturing a piezoelectric actuator as defined in claim 12, wherein the hydrothermal treatment temperature is set to between 120 and 200° C.

22. A method for manufacturing a piezoelectric actuator as defined in claim 12, wherein constant conditions of said hydrothermal treatment include a treatment pressure of between 2 and 10 atm and a treatment time of between 10 and 120 minutes.

23. A method for manufacturing an ink-jet type recording head, comprising the steps of:
   processing a substrate to form pressure chambers; and
   manufacturing a piezoelectric actuator at positions in which said pressure chambers can be pressurized, by a method for manufacturing a piezoelectric actuator as defined in claim 12.

* * * * *

UNITED STATES PATENT AND TRADEMARK OFFICE
CERTIFICATE OF CORRECTION

PATENT NO.    : 6,419,848 B1
DATED         : July 16, 2002
INVENTOR(S)   : Qiu et al.

It is certified that error appears in the above-identified patent and that said Letters Patent is hereby corrected as shown below:

Column 4,
Line 56, delete "reters" and insert -- refers -- therefor.

Column 5,
Line 17, delete the period "." after the word "shared".

Column 6,
Line 21, delete "vapor" and insert -- Vapor -- therefor.
Line 24, delete "he" and insert -- be -- therefor.

Column 8,
Line 20, delete "therefore".
Line 24, delete the comma "," and insert a period -- . -- therefor.
Line 30, delete "tails" and insert -- fails -- therefor.
Line 44, delete "tilled" and insert -- filled -- therefor.
Line 58, delete "an" and insert -- can -- therefor.

Signed and Sealed this

Tenth Day of December, 2002

JAMES E. ROGAN
*Director of the United States Patent and Trademark Office*